United States Patent [19]
Yang

[11] Patent Number: 6,092,233
[45] Date of Patent: Jul. 18, 2000

[54] PIPELINED BERLEKAMP-MASSEY ERROR LOCATOR POLYNOMIAL GENERATING APPARATUS AND METHOD

[75] Inventor: Honda Yang, Santa Clara, Calif.

[73] Assignee: Adaptec, Inc., Milpitas, Calif.

[21] Appl. No.: 09/046,117

[22] Filed: Mar. 20, 1998

[51] Int. Cl.[7] .................................................. H03M 13/00
[52] U.S. Cl. .......................................... 714/784; 714/781
[58] Field of Search .................................... 714/784, 785, 714/793, 752, 781; 341/94

[56] References Cited

U.S. PATENT DOCUMENTS

| | | | |
|---|---|---|---|
| 4,162,480 | 7/1979 | Berlekamp | 714/784 |
| 4,845,713 | 7/1989 | Zook | 714/784 |
| 5,583,499 | 12/1996 | Oh | 341/94 |
| 5,701,314 | 12/1997 | Armstrong et al. | 714/765 |
| 5,719,884 | 2/1998 | Roth et al. | 714/755 |
| 5,790,075 | 10/1999 | Wasada | 714/784 |
| 5,805,616 | 9/1998 | Oh | 714/784 |
| 5,805,617 | 9/1998 | Im | 714/785 |

OTHER PUBLICATIONS

Jah–Ming Hsu et al., An Area–Efficient VLSI Architecture for Decoding of Reed–Solomon Codes, IEEE, pg. 3291 to 3294, 1996.

Zarowski, Parallel Implementation of the Schur Berlekamp–Massey Algorithm on a Linearly Connected Processor Array, IEEE, pg. 930 to 933, 1995.

S. Lin and D. Costello, Jr., "Error Control Coding", Published Oct. 1982, © 1983, Prentice–Hall, Inc. Englewood Cliffs, NJ, pp. 167–174.

S. Wilson, "Digital Modulation and Coding", 1996, Ch. 5, pp. 470–472, Prentice–Hall, NJ.

N. Glover and T. Dudley, "Practical Error Correction Design for Engineers", 1991, Cirrus Logic, Inc., CO, Rev. $2^{nd}$ Ed.

W.W. Peterson and E.J. Weldon, Jr., "Error–Correcting Codes", 1972, ($12^{th}$ printing 1994), Mass, Inst. Of Technology, pp. 131–136.

Stephen B. Wicker, "The Decoding of BCH and Reed–Solomon Codes", pp. 203–234, Chap. 9 of "Error Control Systems for Digital Communication and Storage", © 1995, Prentice–Hall, Inc., Upper Saddle River, NJ.

*Primary Examiner*—Albert De Cady
*Assistant Examiner*—Shelly A Chase
*Attorney, Agent, or Firm*—Martine Penilla & Kim, LLP

[57] ABSTRACT

The present invention provides an apparatus for generating an error locator polynomial from a plurality of partial syndromes. The partial syndromes are generated from a data sector sequentially read from a storage medium. The apparatus comprises discrepancy circuitry, correction polynomial circuitry, connection polynomial circuitry, and a control circuitry. The discrepancy circuitry is configured to receive a selected partial syndrome for generating a discrepancy $\Delta^{(k)}$. The correction polynomial circuitry is configured to receive the kth discrepancy $\Delta^{(k)}$ from the discrepancy circuitry for generating an associated correction polynomial $T(z)$. The connection polynomial circuitry is configured to receive the kth discrepancy $\Delta^{(k)}$ from the discrepancy circuitry for generating an associated connection polynomial $\Lambda^{(k)}(z)$. The control circuitry provides sequencing and control signals to the discrepancy circuitry, the correction polynomial circuitry, and the connection polynomial circuitry in accordance with Berlekamp-Massey algorithm. The connection polynomial circuitry outputs the kth connection polynomial $\Lambda^{(k)}(z)$ as an error locator polynomial when k is equal to the total number of partial syndromes.

52 Claims, 12 Drawing Sheets

| $\Delta^{(1)}$ | $\Lambda^{(1)}$ | $T^{(1)}$ | $\Delta^{(2)}$ | $\Lambda^{(2)}$ | $T^{(2)}$ | $\Delta^{(3)}$ | $\Lambda^{(3)}$ | $T^{(3)}$ | $\Delta^{(4)}$ | $\Lambda^{(4)}$ | $T^{(4)}$ |
|---|---|---|---|---|---|---|---|---|---|---|---|
| 1 | 1 | 1 | 1 | 1 | 1 | 1 | 2 | 2 | 2 | 2 | 2 |
| $\Delta^{(5)}$ | $\Lambda^{(5)}$ | $T^{(5)}$ | $\Delta^{(6)}$ | $\Lambda^{(6)}$ | $T^{(6)}$ | $\Delta^{(7)}$ | $\Lambda^{(7)}$ | $T^{(7)}$ | $\Delta^{(8)}$ | $\Lambda^{(8)}$ | $T^{(8)}$ |
| 2 | 3 | 3 | 3 | 3 | 3 | 3 | 4 | 4 | 4 | 4 | 4 |
| $\Delta^{(9)}$ | $\Lambda^{(9)}$ | $T^{(9)}$ | $\Delta^{(10)}$ | $\Lambda^{(10)}$ | $T^{(10)}$ | $\Delta^{(11)}$ | $\Lambda^{(11)}$ | $T^{(11)}$ | $\Delta^{(12)}$ | $\Lambda^{(12)}$ | $T^{(12)}$ |
| 4 | 5 | 5 | 5 | 5 | 5 | 5 | 6 | 6 | 6 | 6 | 6 |

FIG. 11

| $\Delta^{(1)}$ | $\Lambda^{(1)}$ | $T^{(1)}$ | $\Delta^{(2)}$ | $\Lambda^{(2)}$ | $T^{(2)}$ | $\Delta^{(3)}$ | $\Lambda^{(3)}$ | $T^{(3)}$ | $\Delta^{(4)}$ | $\Lambda^{(4)}$ | $T^{(4)}$ |
|---|---|---|---|---|---|---|---|---|---|---|---|
| 1 | 1 | 1 | 1 | 1 | 1 | 1 | 1 | 1 | 1 | 1 | 1 |
| $\Delta^{(5)}$ | $\Lambda^{(5)}$ | $T^{(5)}$ | $\Delta^{(6)}$ | $\Lambda^{(6)}$ | $T^{(6)}$ | $\Delta^{(7)}$ | $\Lambda^{(7)}$ | $T^{(7)}$ | $\Delta^{(8)}$ | $\Lambda^{(8)}$ | $T^{(8)}$ |
| 1 | 1 | 1 | 1 | 1 | 1 | 1 | 2 | 2 | 2 | 2 | 2 |
| $\Delta^{(9)}$ | $\Lambda^{(9)}$ | $T^{(9)}$ | $\Delta^{(10)}$ | $\Lambda^{(10)}$ | $T^{(10)}$ | $\Delta^{(11)}$ | $\Lambda^{(11)}$ | $T^{(11)}$ | $\Delta^{(12)}$ | $\Lambda^{(12)}$ | $T^{(12)}$ |
| 2 | 2 | 2 | 2 | 2 | 2 | 2 | 2 | 2 | 2 | 2 | 2 |

FIG. 12

PIPELINED BERLEKAMP-MASSEY ERROR LOCATOR POLYNOMIAL GENERATING APPARATUS AND METHOD

BACKGROUND OF THE INVENTION

1. Field of the Invention

This invention relates generally to hard disk error correction code decoders, and more particularly to devices for generating error location polynomials using Reed-Solomon error correction code technique.

2. Description of the Related Art

Modern computer systems typically include one or more hard disk drives to store large amount of data and programs. As a mass storage circuitry, hard disk drives can provide information to the processors in the computer systems through random access memory (RAM) circuitry such as dynamic random access memory (DRAM), static random access memory (SRAM), etc. Since RAM circuitry is costly, storing information in a hard disk and retrieving the information as needed is generally far more economical than using comparable RAM circuitry for most computer applications.

Hard disk drives typically store information as sequential bits using magnetic technology. Like most recording technology, reading the sequential data bits from a hard disk often generates errors due to noise, manufacturing imperfections of the physical medium, dust, etc. To detect and correct such errors, hard disk drives typically implement an error correction code (ECC) scheme in writing to and reading from hard disk drives.

A typical ECC scheme computes ECC bytes for a given block of user data such as a sector. Then, computed ECC bytes are appended to a block of user data and then recorded on a hard disk. When the block of data is read, the ECC scheme computes error locations and error patterns in the user data by decoding the ECC bytes.

Prior Art FIG. 1 illustrates a block diagram of a conventional computer system 100 including a host computer 118 that receives data from a disk 102 in a hard disk drive. A motor 104 spins the disk 102 containing the data. A read/write head 106 attached to an actuator 108 searches for a track and sectors that contain the desired data. Upon finding the desired sectors, the read/write head 106 reads the data sequentially from the disk 102. An amplifier 110 amplifies the data signals and transmits the amplified data signals to an analog-to-digital converter 112. The analog-to-digital converter 112 converts the amplified data signals into digital data bits and transmits the data bits to a deserializer 114. The deserializer 114 receives the sequential data bits and converts the data into a series of blocks called sectors, each of which is typically 512 bytes of user data and ECC bytes appended to the user data bytes. The deserializer 114 sequentially transmits the sectors to an error detection and correction (EDAC) circuitry 116, which detects errors in the received sector and, if correctable, corrects the detected errors using an ECC scheme. The EDAC circuitry 116 then transmits the error corrected user data to the host computer 118.

Prior Art FIG. 2 shows a more detailed block diagram of the EDAC circuitry 116. As mentioned above, the EDAC circuitry 116 receives a sector 200 of user data bytes and ECC bytes in sequential manner. At the front end of the EDAC circuitry 116, a syndrome generator 202 receives the sector 200 and generates partial syndromes from the received sector data. Syndrome generators are well known in the art and are typically implemented as a linear feedback shift register circuit. The generated partial syndrome indicates whether an error is present in the received sector 200. For example, a zero syndrome indicates that no error has been detected. On the other hand, a non-zero syndrome indicates that one or more errors has been detected in the received data.

With continued reference to Prior Art FIG. 2, the generated partial syndromes are then transmitted to an ECC decoder 204, which includes error locator polynomial generator 206, an error locator polynomial solver 208, and an error pattern generator 210. The error locator polynomial generator 206 receives the partial syndromes from the syndrome generator 202 and generates an error locator polynomial for the received sector 200. Using the error locator polynomial, the error locator polynomial solver computes the error locations in the received sector and transmits the error locations to th error pattern generator 210. The error pattern generator 21 computes error patterns in the received sector 200 using the error locations and partial syndromes. The EDAC uses the error locations and error patterns to correct the errors in the received sector.

One of the most robust hard disk ECC scheme employs conventional Reed-Solomon code to encode user data for reliable recovery of the original data. Modern hard disk drives generally employ Reed-Solomon error correcting code (ECC) for burst error correction to help achieve higher areal density. A Reed-Solomon code is completely defined by a generator polynomial, g(z), whose zeroes are consecutive powers of field elements of Galois Field, GF(q): $\alpha^{m_0}$, $\alpha^{m_0+1}, \ldots, \alpha^{m_0+c-1}$, where $m_0$ is defined between 0 and $q-2$ (i.e., $0 \leq m_0 \leq q-2$) and c is the number of checkbytes. The vector form of the received sector is represented as $(r_0, r_1, \ldots, r_{n-1})$. Assuming that a block length n code and v errors occurred in locations corresponding to indexes $i_1$, $i_2, \ldots, i_v$, the partial syndromes are defined by a partial syndrome equation as follows:

$$S_j = \sum_{i=0}^{n-1} r_i \alpha^{i(m_0+j)} = \sum_{k=1}^{v} e_{i_k} \alpha^{i_k(m_0+j)} \quad (1)$$

According to equation (1), the error location number for position $i_k$ is defined to be $\alpha^{i_k}$. The syndrome components define a series of c algebraic equations with 2v unknowns.

Assuming $\Lambda(z)$ is an error locator polynomial that has its roots the inverses of the v error locators $\{\alpha_{i_k}\}$, the error locator polynomial $\Lambda(z)$ can be expressed as:

$$\Lambda(z) = \prod_{l=1}^{v} (1 - z\alpha^{i_l}) = \Lambda_v z^v + \Lambda_{v-1} z^{v-1} + \ldots + \Lambda_1 z + \Lambda_0 \quad (2)$$

A key equation relating the partial syndromes to the error locator polynomial may be defined as:

$$\Lambda_v S_{j-v} + \Lambda_{v-1} S_{j-v+1} + \ldots + \Lambda_1 S_{j-1} = -S_j \quad (3)$$

Based on this relationship, when partial syndromes $S_j$ are given, conventional Berlekamp-Massey algorithm can be used to find the polynomial $\Lambda(z)$ of minimum degree v so that key equation (3) is satisfied.

The Berlekamp-Massey algorithm has five basic parameters: the connection polynomial $\Lambda^{(k)}(z)$, the correction polynomial T(z), the discrepancy $\Delta^{(k)}$, the number of coefficients or errors, L, that is to be detected (e.g., length of a shift register), and the indexing variable k. Berlekamp- Massey algorithm and Reed-Solomon code are well known in the art and is amply described in Error Control Systems for Digital Communication and Storage, ISBN 0-13-200809-2(1995), by Stephen B. Wicker, which is incorporated herein by reference.

Prior Art FIG. 3 illustrates a flow diagram 300 of the operations involved in a conventional Berlekamp-Massey algorithm after receiving partial syndromes in the form of syndrome sequence $S_1, \ldots, S_c$ for a received sector data at the c zeros where c is the number of checkbytes as mentioned above. The Berlekamp-Massey algorithm implements Berlekamp's algorithm for decoding nonbinary BCH and Reed-Solomon codes using Massey's shift-register-based interpretation.

In operation 302, the Belekamp-Massey algorithm initializes variables k, Λ, L, and T: k=0, $\Lambda^{(0)}(z)=1$, L=0, and T(z)=z. Then in operation 304, the index variable k is incremented by 1 and the discrepancy $\Delta^{(k)}$ is computed as follows:

$$\Delta^{(k)} = S_k - \sum_{i=1}^{L} \Lambda_i^{(k-1)} S_{k-i} \qquad (4)$$

In operation 306, the algorithm determines whether $\Delta^{(k)}=0$. If $\Delta^{(k)}$ is equal to zero, the algorithm proceeds to operation 316 where T(z) is set equal to z T(z). On the other hand, if $\Delta^{(k)}$ is not equal to zero, the algorithm proceeds to operation 308 where the value of $\Lambda^{(k)}(z)$ is determined in accordance with an equation $\Lambda^{(k)}(z)=\Lambda^{(k-1)}(z)-\Delta^{(k)}T(z)$.

Then in operation 310, the algorithm determines whether the value of 2L is greater than or equal to k. If the value of 2L is greater than or equal to k, then the algorithm proceeds to operation 316. On the other hand, if 2L is smaller than k, then the algorithm proceeds to set L=k−L in operation 312.

Subsequently in operation 314, T(z) is computed according to an equation $T(z)=\Lambda^{(k-1)}(z)/\Delta^{(k)}$. Following this, T(z) is set as T(z)=z T(z) in operation 316, which has the effect of incrementing the degree of polynomial T(z) by a degree. Then in operation 316, the algorithm determines if k is smaller than c, the number of checkbytes. If k is not smaller than c, the algorithm terminates in operation 320. Otherwise, the algorithm proceeds back to operation 304. When the algorithm 300 terminates in operation 320, the algorithm 300 provides an error locator polynomial, $\Lambda(z)=\Lambda^{(c)}(z)$, whose coefficients indicate the location of errors, if any, in the block of data such as a sector.

Unfortunately, the implementation of the Berlekamp-Massey algorithm typically requires many clock cycles which are dependent on a result from previous cycles. Furthermore, straight forward implementation of Berlekamp-Massey algorithms generally requires numerous storage elements and Galois Field (GF) multipliers, which are major datapath resources requiring a large silicon area.

In view of the foregoing, what is needed is an apparatus and method that can efficiently compute error locator polynomial Λ(z) by implementing Berlekamp-Massey algorithm in reduced clock cycles. What is further needed is an apparatus and method that utilizes less storage elements and GF multipliers, and thus less silicon area.

SUMMARY OF THE INVENTION

Broadly speaking, the present invention fills these needs by providing a pipelined Berlekamp-Massey error polynomial generating apparatus and method. It should be appreciated that the present invention can be implemented in numerous ways, including as a process, an apparatus, a system, a device, a method, or a computer readable medium. Several inventive embodiments of the present invention are described below.

In one embodiment, the present invention provides an apparatus for generating an error locator polynomial from a plurality of partial syndromes. The partial syndromes are generated from a data sector sequentially read from a storage medium. The apparatus comprises discrepancy circuitry, correction polynomial circuitry, connection polynomial circuitry, and a control circuitry. The discrepancy circuitry is configured to receive a selected partial syndrome for generating a discrepancy $\Delta^{(k)}$. The correction polynomial circuitry is configured to receive the kth discrepancy $\Delta^{(k)}$ from the discrepancy circuitry for generating an associated correction polynomial T(z). The connection polynomial circuitry is configured to receive the kth discrepancy $\Delta^{(k)}$ from the discrepancy circuitry for generating an associated connection polynomial $\Lambda^{(k)}(z)$. The control circuitry provides sequencing and control signals to the discrepancy circuitry, the correction polynomial circuitry, and the connection polynomial circuitry in accordance with Berlekamp-Massey algorithm. The connection polynomial circuitry outputs the kth connection polynomial $\Lambda^{(k)}(z)$ as an error locator polynomial when k is equal to the total number of partial syndromes.

In another embodiment, the present invention provides a method for generating an error locator polynomial from a plurality of partial syndromes. The partial syndromes are generated from a data sector that is read sequentially from a storage medium. The method receives the plurality of partial syndromes. The method then initializes Berlekamp-Massey algorithm variables k, L, T(z), and $\Lambda^{(0)}(z)$ to 0, 0, z, and 1, respectively. Next, the method increments k by 1 and determines a discrepancy $\Delta^{(k)}$. The method determines a connection polynomial $\Lambda^{(k)}(z)$ and a correction polynomial T(z) of the Berlekamp-Massey algorithm based on the discrepancy $\Delta^{(k)}$ and the connection polynomial $\Lambda^{(k-1)}(z)$. While the connection polynomial $\Lambda^{(k)}(z)$ and the correction polynomial T(z) are being determined, the method increments k by 1 and determines the discrepancy $\Delta^{(k)}$ by delaying the evaluation of discrepancy $\Delta^{(k)}$ until $\Lambda^{(k-1)}(z)$ becomes available. The method increments the degree of the error correction polynomial T(z) and repeats the determination of the discrepancy $\Delta^{(k-1)}$, the connection polynomial $\Lambda^{(k)}(z)$ and the correction polynomial T(z) in parallel in accordance with the Berlekamp-Massey algorithm to generate an error locator polynomial.

In yet another embodiment, an apparatus includes a discrepancy determining means, a connection and correction polynomial determining means, and a control means. The discrepancy determining means is configured to receive the plurality of partial syndromes for determining a discrepancy. The connection and correction polynomial determining means is configured to receive the discrepancy for determining a connection polynomial and a correction polynomial. The control means provides sequencing and control signals to the discrepancy determining means, the connection and correction polynomial determining means. The connection and correction polynomial determining means outputs the connection polynomial as an error locator polynomial.

Advantageously, the present invention allows pipelined parallel processing of the discrepancy $\Delta^{(k)}$ with the connection polynomial $\Lambda^{(k)}(z)$ and a correction polynomial T(z). Instead of computing these variables in sequence, one at a time, the pipelined parallel processing significantly improves processing cycles needed to compute these variables, which require resource intensive GF multipliers. The pipelined parallel processing is accomplished by resolving data dependency between two pipeline stages by delaying discrepancy processing by one cycle. In addition, the present invention computes the coefficients of $\Lambda^{(k)}(z)$ and $T(z)$ polynomials at the same time. This parallel processing results in saving of a storage array. Additionally, the present invention provides high clock frequency performance by inserting pipelining storage elements to break up long timing path. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

Prior Art

Prior Art

Prior Art

FIG. 11 illustrates an exemplary number of clock cycles needed to compute major variables sequentially when using a single GF multiplier in implementing the Berlekamp-Massey algorithm in a sequential manner.

FIG. 12 shows an exemplary number of cycles needed to compute the major variables sequentially when using three GF multipliers to implement the Berlekamp-Massey algorithm in a sequential manner.

DETAILED DESCRIPTION OF THE PREFERRED EMBODIMENTS

An invention is described for pipelined Berlekamp-Massey error locator polynomial generating apparatus and method. It will be obvious, however, to one skilled in the art, that the present invention may be practiced without some or all of these specific details. In other instances, well known process operations have not been described in detail in order not to unnecessarily obscure the present invention.

In accordance with one embodiment of the present invention, the three major variables of the Berlekamp-Massey algorithm, namely, $\Delta^{(k)}$, $\Lambda^{(k)}(z)$, and $T(z)$, are computed by employing a two-stage parallel pipelined process. In particular, since both $\Lambda^{(k)}(z)$ and $T(z)$ depend on the result of $\Delta^{(k)}$, $\Lambda^{(k)}(z)$ and $T(z)$ are computed after the result of $\Delta^{(k)}$ becomes available. In addition, since dependency also exists between $\Lambda^{(k)}(z)$ and $T(z)$ because both $\Lambda^{(k)}(z)$ and $T(z)$ contain the term $\Lambda^{(k-1)}(z)$, $\Lambda^{(k)}(z)$ and $T(z)$ are preferably computed concurrently in parallel. In this manner, a storage array, which otherwise would be required to store $\Lambda^{(k-1)}(z)$ after the new $\Lambda^{(k)}(z)$ is generated, is eliminated.

Figure 4:
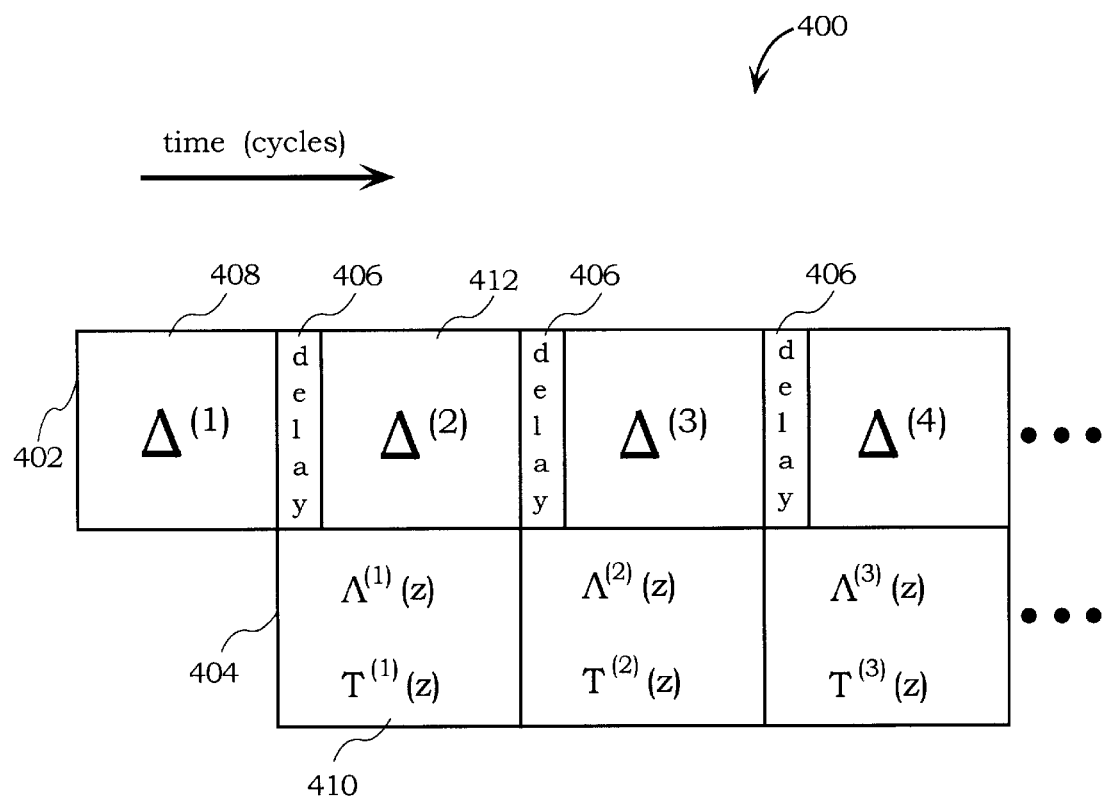
FIG. 4 illustrates a block timing diagram of two parallel pipeline stages in accordance implementing the parallel pipeline process.

FIG. 4 illustrates a block timing diagram of two parallel pipeline stages 400 in accordance implementing the parallel pipeline process. A first stage 402 processes $\Delta^{(k)}$ while a second stage 404 computes $\Lambda^{(k)}(z)$ and $T(z)$. In this pipelined architecture, the processing of $\Delta^{(k)}$ precedes the processing of $\Lambda^{(k)}(z)$ and $T(z)$ so that the value of $\Delta^{(k)}$ can be used in computing $\Lambda^{(k)}(z)$ and $T(z)$. For example, the scalar value of $\Delta^{(1)}$ in a block 408 is first computed and then the value is used in computing $\Lambda^{(1)}(z)$ and $T(z)$ in a block 410. While the variables $\Delta^{(1)}(z)$ and $T(z)$ in the block 410 are being computed, the next value of $\Delta^{(k)}$, which is $\Delta^{(2)}$ in block 612, is computed in parallel. The pipeline stages 402 and 404 proceeds in this manner k becomes greater than or equal to c, the number of partial syndromes.

However, when $\Delta^{(k)}$ is being computed, $\Lambda^{(k-1)}(z)$ is not readily available since they are processed in parallel. To resolve this issue, computation of each $\Delta^{(k)}$ is delayed by one cycle 406 until the first coefficient of $\Lambda^{A(k-1)}(z)$ in the parallel stage becomes available. That is, the processing of $\Delta^{(k)}$ trails the processing of $\Lambda^{(k-1)}(z)$ so that the first $\Lambda^{(k-1)}(z)$ coefficient is available when computing the first summation of $$\sum_{i=1}^{L} \Lambda_i^{(k-1)} S_{k-i}$$

in equation (4). For example, the computation of $\Delta^{(2)}$ in block 412 is delayed by one clock cycle 406 for the first coefficient of $\Lambda^{(1)}(z)$ to become available.

Figure 5:
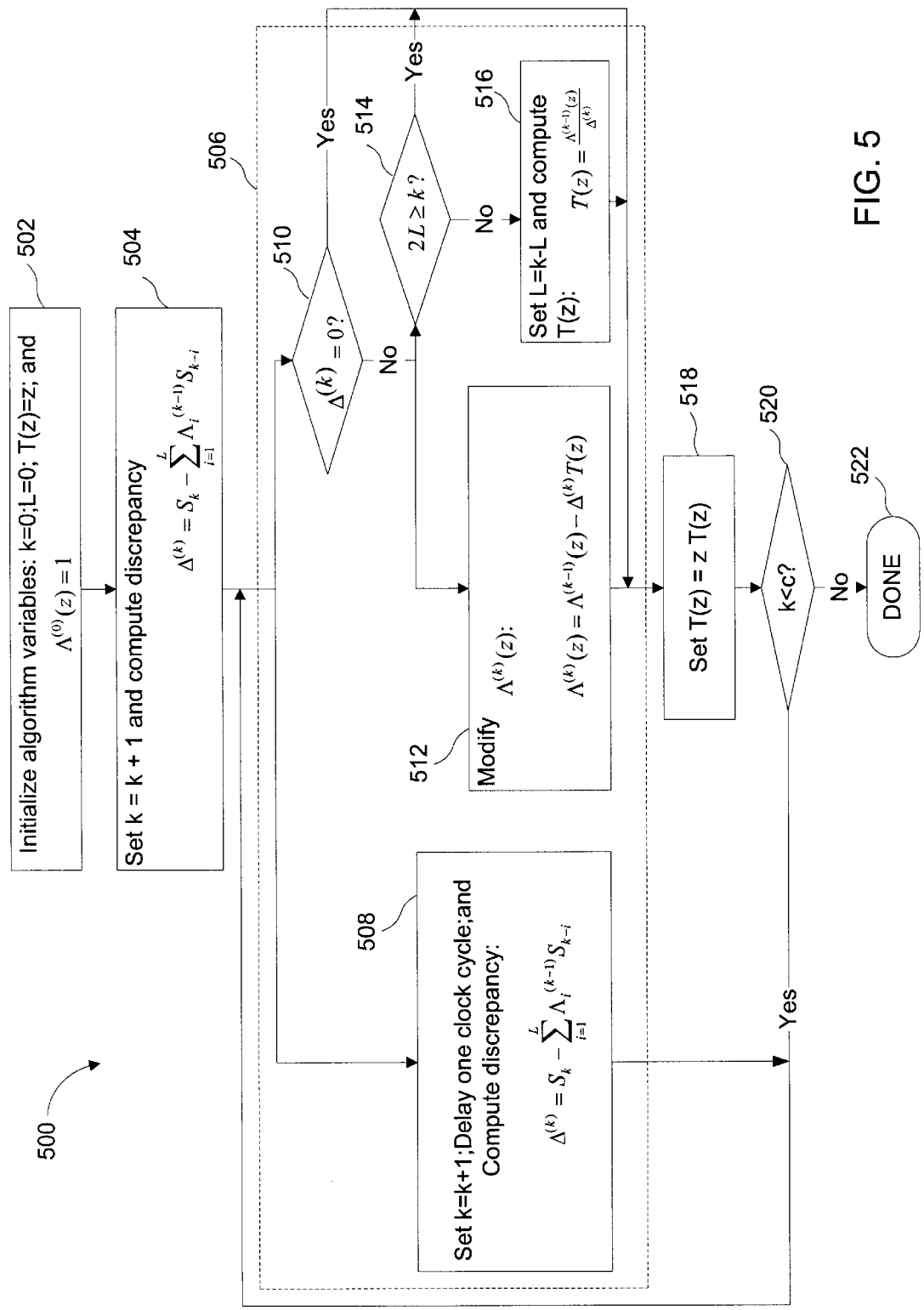
FIG. 5 shows a flow diagram of a pipelined Berlekamp-Massey algorithm in accordance with one embodiment of the present invention.

FIG. 5 shows a flow diagram of a two-stage pipelined Berlekamp-Massey algorithm 500 in accordance with one embodiment of the present invention. In operation 502, the Berlekamp-Massey algorithm 500 initializes variables k, $\Lambda$, L, and T: k=0, $\Lambda^{(0)}(z)=1$, L=0, and T(z)=z. Then in operation 504, the index variable k is incremented by 1 and the discrepancy $\Delta^{(k)}$ is computed as follows in accordance with the discrepancy equation (4):

$$\Delta^{(k)} = S_k - \sum_{i=1}^{L} \Lambda_i^{(k-1)} S_{k-i}.$$

Since L is initially equal to zero, the operation 504 computes the first clock cycle discrepancy, $\Delta^{(1)}$.

After computing $\Delta^{(1)}$, the algorithm 500 performs operation 506, which computes the major variables $\Delta^{(k)}$, $\Lambda^{(k)}$, and T(z) in parallel in sub-operations 508, 512, and 516, respectively. In operation 508, the algorithm 500 increments the index variable k by 1 and waits for the for the coefficient of $\Lambda^{(k-1)}$ to become available from operation 512. Preferably, the delay in waiting for the coefficient of $\Lambda^{(k-1)}$ to become available from operation 512 is one clock cycle. Then, when the $\Lambda^{(k-1)}$ result becomes available after the delay in operation 508, the algorithm 500 computes the discrepancy $\Delta^{(k)}$ in accordance with the discrepancy equation (4) in the Berlekamp-Massey algorithm.

While performing operation 508, the pipelined Berlekamp-Massey algorithm 500 also performs operations 510, 512, 514, and 516 concurrently. In operation 510, the Berlekamp-Massey algorithm 500 determines whether $\Delta^{(k)}$ is equal to 0. If $\Delta^{(k)}$ is equal to zero, the algorithm 500 proceeds to operation 518 where T(z) is set to T(z) multiplied by z. On the other hand, if $\Delta^{(k)}$ is not equal to zero, then the algorithm 500 proceeds to operations 512 and 514 concurrently.

In operation 512, the algorithm 500 computes the value of $\Lambda^{(k)}(z)$ in accordance with the error location polynomial equation $\Lambda^{(k)}(z)=\Lambda^{(k-1)}(z)-\Delta^{(k)}$ T(z) using the discrepancy $\Delta^{(k)}$ generated in the previous pipeline cycle. In operation 514, the Berlekamp-Massey algorithm 500 determines whether the value of 2L is greater than or equal to k. If the value of 2L is greater than or equal to k, then the algorithm 500 proceeds to operation 518. On the other hand, if 2L is smaller than k, then the algorithm 500 proceeds to operation 516. During operation 516, L is set equal to (k−L) and the correction polynomial T(z) is computed in accordance with the correction polynomial equation, $T(z)=\Lambda^{(k-1)}(z)/\Delta^{(k)}$, by using the discrepancy $\Delta^{(k)}$ generated in the previous pipeline cycle.

After computing $\Lambda^{(k)}(z)$ and T(z) in operations 512 and 516, respectively, the algorithm proceeds to operation 518 where T(z) is set to zT(z). Multiplying T(z) by z, in effect, increments the degree of T(z) polynomial. Then in operation 520, the algorithm 520 determines whether k is less than c, the number of checkbytes (e.g., check symbols, redundancy symbols, etc.). If k is less than c, then the algorithm proceeds back to operation 506. The algorithm 500 also proceeds back to operation 506 after operation 508. Preferably at this time, the algorithm synchronizes the index variable k by setting k equal to the incremented k value of operation 508. On the other hand, if k is greater than or equal to c, then the algorithm 500 terminates in operation 522. When the algorithm 500 terminates, it generates the error locator polynomial, $\Lambda(z)=\Lambda^{(c)}(z)$.

Figure 6:
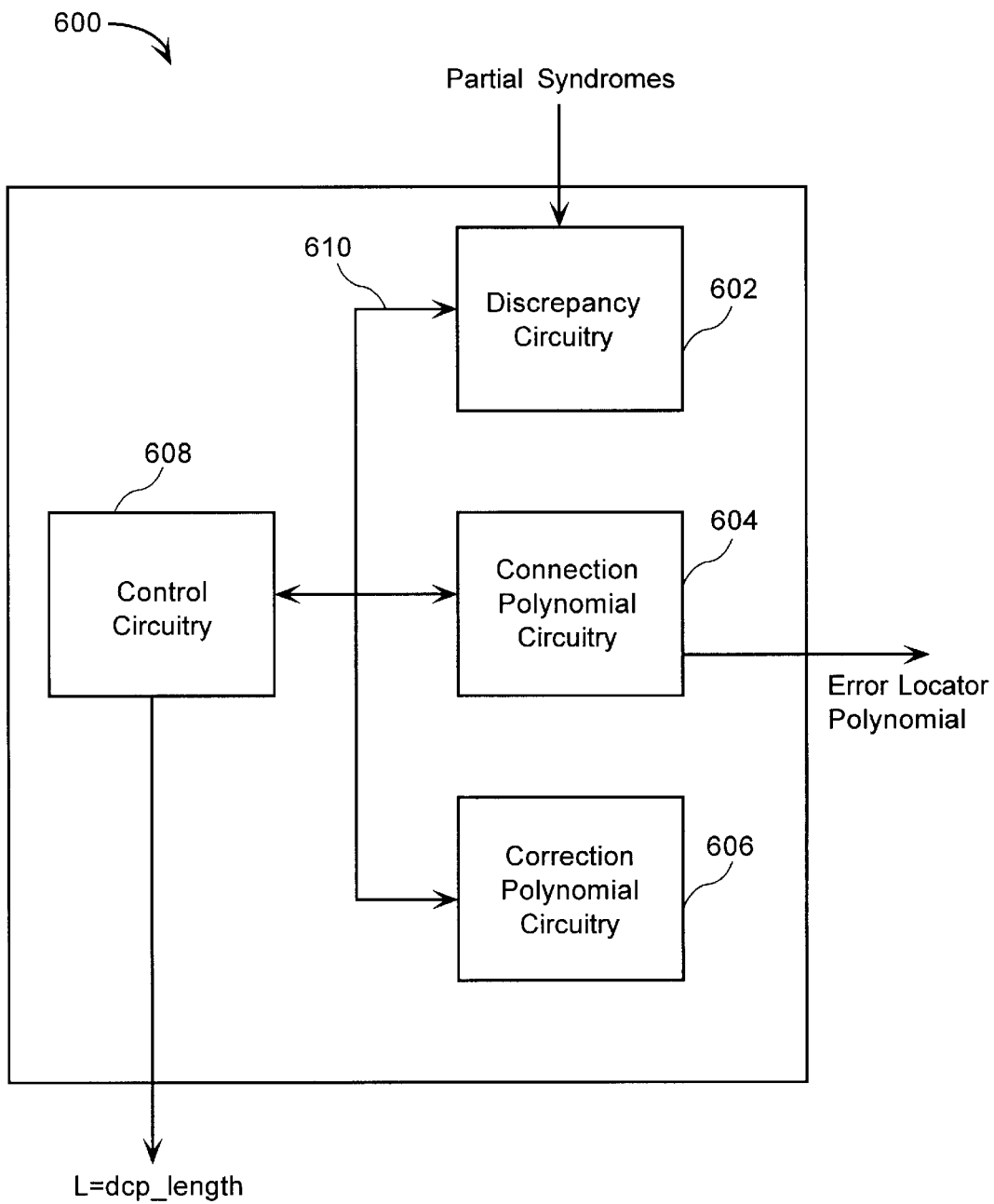
FIG. 6 illustrates a block diagram of an error locator polynomial generator apparatus in accordance with one embodiment of the present invention.

FIG. 6 illustrates a block diagram of an error locator polynomial generator apparatus 600 in accordance with one embodiment of the present invention. The error locator polynomial generator apparatus 600 receives a plurality of partial syndromes from a syndrome generator to determine an error locator polynomial and L, the degree of the error locator polynomial. The error locator polynomial generator apparatus 600 includes discrepancy circuitry 602, connection polynomial circuitry 604, correction polynomial circuitry 606, and control circuitry 608.

With continuing reference to FIG. 6, the control circuitry 608 is coupled to the discrepancy circuitry 602, the connection polynomial circuitry 604, and the correction polynomial circuitry 606 through a bus 610, which is a set of lines for transmitting signals. The control circuitry 608 provides sequencing and control signals to the discrepancy circuitry 602, the connection polynomial circuitry 604, and the correction polynomial circuitry 606 in accordance with the Berlekamp-Massey algorithm 500. When k is equal to the total number of checkbytes c, the connection polynomial circuitry outputs the resulting connection polynomial $\Lambda^{(c)}(z)$ as an error locator polynomial. In addition, the control circuitry 608 outputs L or dcp_length, which represents the degree of the error locator polynomial.

The discrepancy circuitry 602 receives partial syndromes from a syndrome generator (not shown) to generate discrepancy $\Delta^{(k)}$. The connection polynomial circuitry 604 is coupled to the discrepancy circuitry 602 through the bus 610 to receive the discrepancy $\Delta^{(k)}$ from the discrepancy circuitry 602 for generating an associated connection polynomial $\Lambda^{(k)}(z)$. The correction polynomial circuitry 606 is also coupled to the discrepancy circuitry 602 and the connection polynomial circuitry 604 through the bus 610 to receive the discrepancy $\Delta^{(k)}$ from the discrepancy circuitry for generating an associated correction polynomial T(z).

Figure 7:
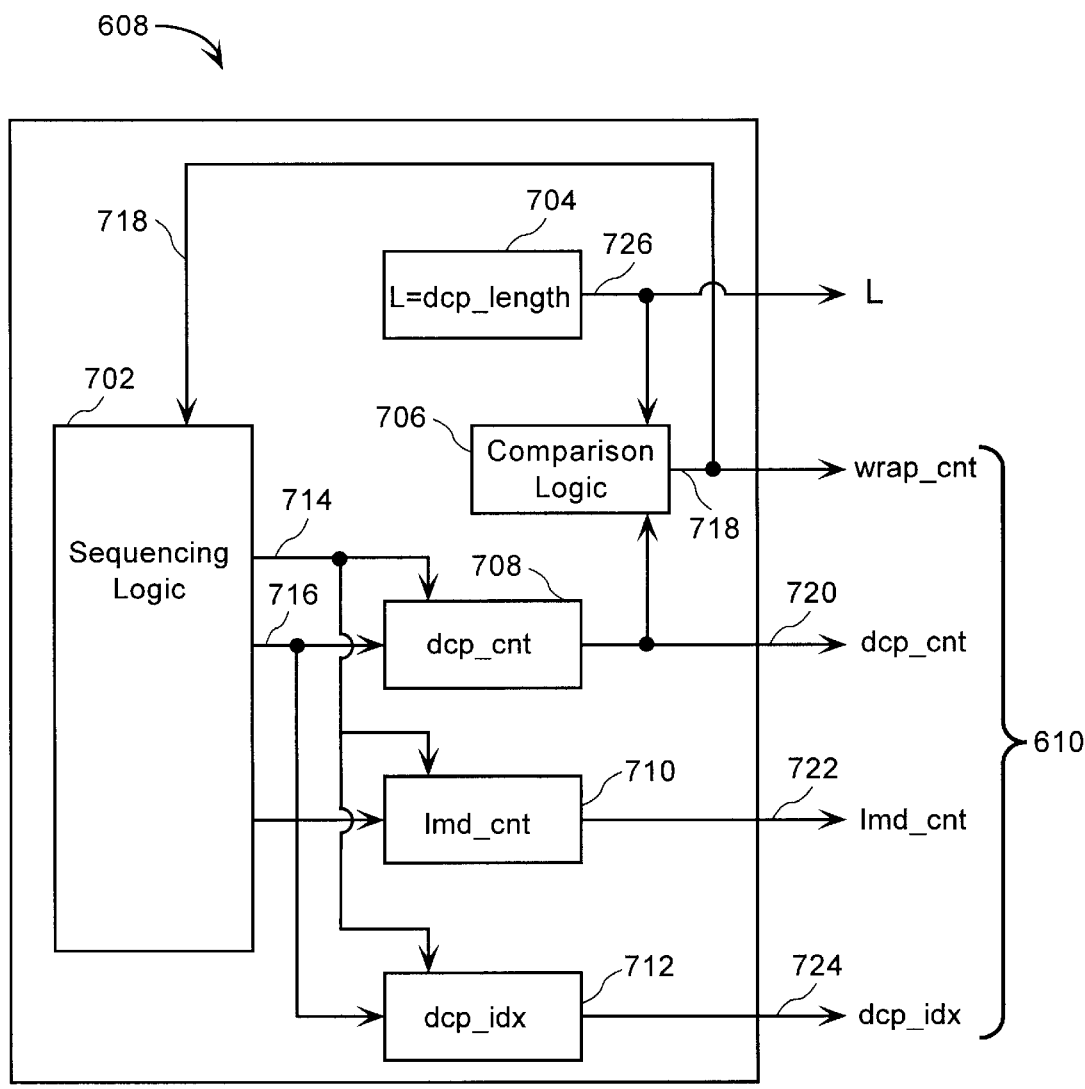
FIG. 7 shows a block diagram of the control circuitry for controlling the pipelined Berlekamp-Massey apparatus.

FIG. 7 shows a block diagram of the control circuitry 608 for controlling the Berlekamp-Massey apparatus 600. The control circuitry 608 includes a sequencing logic 702 for sequencing and setting counters used in the Berelekamp-Massey apparatus 600. The sequencing logic 702 is coupled to counters dcp_cnt 708, lmd_cnt 710, and dcp_idx 712 via lines 714 and 716. The line 714 transmits a reset signal from the sequencing logic 702 for resetting the counters dcp_cnt 708, lmd_cnt 710, and dcp_idx 712. The line 716, on the other hand, transmits an increment signal for incrementing, preferably by one each time, the contents of the counters dcp_cnt 708, lmd_cnt 710, and dcp_idx 712. The values in the counters dcp_cnt 708, lmd_cnt 710, and dcp_idx 712 are transmitted via lines 720, 722, and 724, respectively, to the discrepancy circuitry 602, the connection polynomial circuitry 604, and the correction polynomial circuitry 606.

The control circuitry 608 of FIG. 7 also generates a wrap_cnt signal and transmits the signal over line 718. For this purpose, the control circuitry 608 includes an L or dcp_length counter 704 and a comparison logic circuit 706. The comparison logic circuit 706 receives the content of L or dcp_length counter over line 726 and the dcp_cnt signal over line 720. The comparison logic circuit 706 then compares the received values and generates the wrap_cnt output signal and transmits the signal to the sequencing logic 702 and other parts of the Berlekamp-Massey apparatus 600 via line 718. The control circuitry 608 also outputs L over line 726. The aforementioned bus 610 coupling the control circuitry 608 with the discrepancy circuitry 602, the connection polynomial circuitry 604, and the correction polynomial circuitry 606 includes lines 718, 720, 722, and 724.

With continuing reference to FIG. 7, the counter dcp_idx 712 maintains and updates the value of the index variable k described above. On the other hand, the counter dcp_cnt 708 counts and controls the number of clock cycles each pipeline cycle takes. Specifically, when the value in counter dcp_cnt 708 has been incremented to L or dcp_length, the comparison logic circuit 706 generates the wrap_cnt signal over line 718, which signals that the current pipeline cycle is complete. The wrap_cnt signal also triggers the register dcp_cnt 708 to wrap around to 0 (i.e., reset) on the next cycle. The counter dcp_cnt 708 is also used to select one of the $\Lambda(z)$ polynomial coefficients in the discrepancy circuitry 602.

In addition, the Berlekamp-Massey apparatus 600 uses the lmd_cnt signal over line 722 to select one of the $\Lambda(z)$ polynomial coefficients in the connection polynomial circuitry 604. The sequencing logic 702 initializes the value in the counter lmd_cnt 710 to 1 at the beginning of each pipeline cycle. Then at every clock, the counter lmd_cnt 710 is incremented until reset by the sequencing logic 702 upon receiving wrap_cnt signal over line 718.

Figure 8:
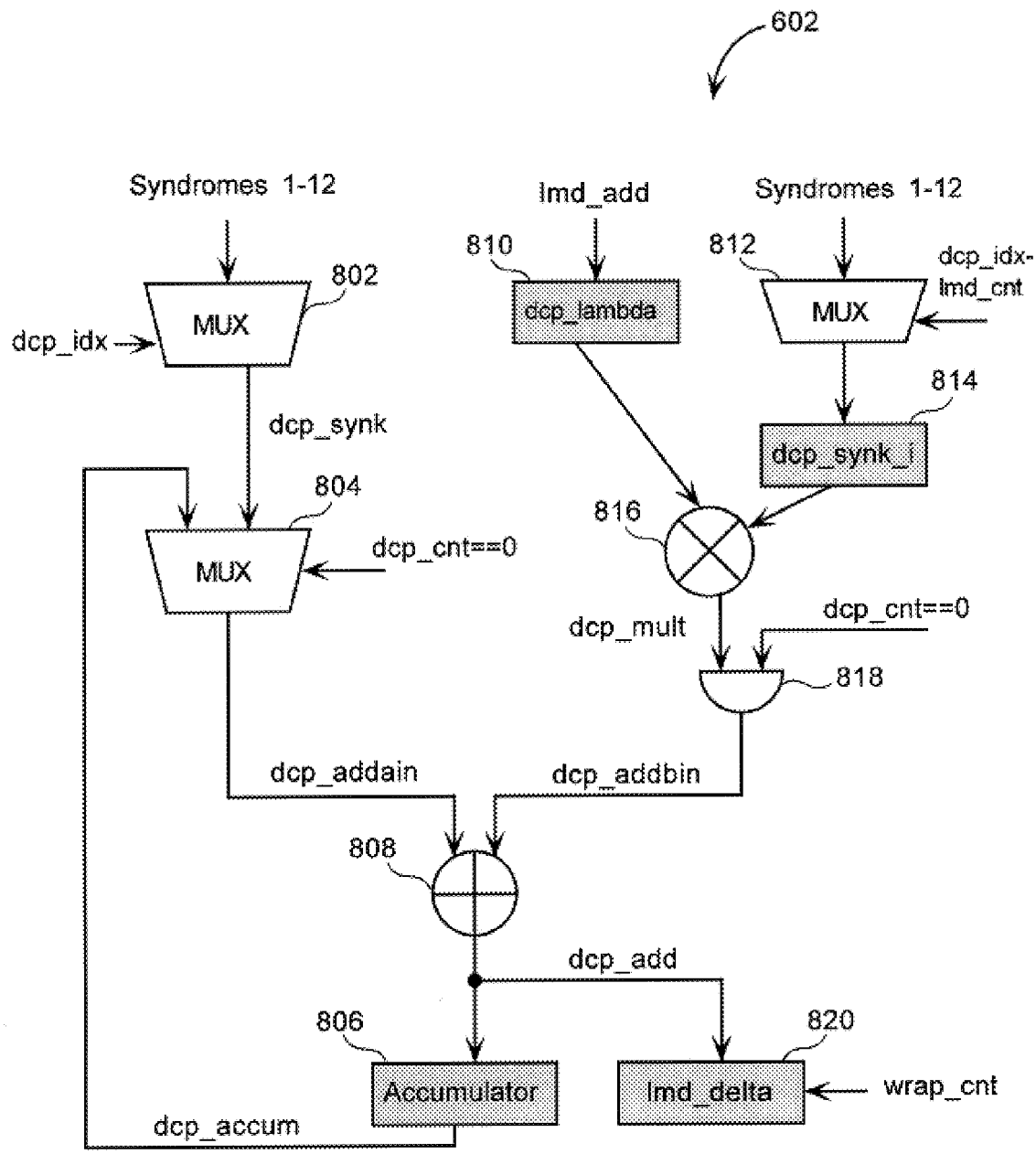
FIG. 8 illustrates a detailed hardware diagram of the discrepancy circuitry.

FIG. 8 illustrates a detailed hardware diagram of the discrepancy circuitry 602. The discrepancy circuitry 602 determines the discrepancy scalar value $\Delta^{(k)}$ in accordance with the equation (4) of the Berlekamp-Massey algorithm. The discrepancy circuitry 602 includes a multiplexer 802 for receiving the partial syndromes and selecting an appropriate partial syndrome, dcp_synk. A control signal dcp_idx received over line 724 controls the multiplexer 802 to select a proper partial syndrome from the partial syndromes. The control signal dcp_idx corresponds to the index variable k in the Berlekamp-Massey algorithm.

The multiplexer 802 transmits the selected partial syndrome to a multiplexer 804. The multiplexer 804 receives as inputs the selected partial syndrome and an accumulated partial result of a discrepancy value of $\Delta^{(k)}$ from an accumulator 806. The control signal, dcp_cnt, from the control circuitry 608 enables the multiplexer 804 to select and output one of the input partial syndromes. Specifically, the multiplexer 804 transmits the selected input (i.e., dcp_addain) to the adder 808 as an input. Preferably, the adder 808 is a GF adder.

On the other side, the content of a register dcp_lambda 810, which is lmd_add transmitted from the connection polynomial circuitry 604, is fed into a GF multiplier 816. A multiplexer 812 also receives the partial syndromes and selects a proper partial syndrome, $S_{k-i}$, in response to a control signal (dcp_idx–lmd_cnt). The selected partial syndrome, $S_{k-i}$, is then stored in a register dcp_synk_i 814, which feeds its content to the GF multiplier 816 for GF multiplication with dcp_addain to generate an output product, dcp_mult. An AND gate 818 receives the dcp_mult and dcp_cnt to generate an output, dcp_addbin.

The adder 808 adds the values of dcp_addain and dcp_addbin to produce a sum, dcp_add. The sum, dcp_add, is then fed into an accumulator 806 and a lmd_delta register 820. The accumulated content, dcp_accum, of the accumulator is fed back into the multiplexer 804 to accumulate the results for subsequent operations. The lmd_delta register 820 receives the wrap_cnt signal over line 718 from the control circuitry 608 and is loaded with dcp_add signal in response to the wrap_cnt signal.

In operation, since the discrepancy circuitry 602 lags behind the connection polynomial circuitry 604 and the correction polynomial circuitry 606 by one clock cycle due to the above mentioned data dependency, the GF multiplier 816 is idle in the first clock cycle of every pipeline cycle when dcp_cnt is equal to 0. This enables one of the partial syndromes to be loaded into the accumulator 806 through the multiplexers 802 and 804. The control signal (dcp_idx–lmd_cnt) enables the multiplexer to prefetch one operand of the GF multiplier 816 and save it the dcp_synk_i register 814. This has the benefit of breaking up a relatively long timing path since selecting that operand involves a subtraction operation (dcp_idx–lmd_cnt) and a multiplexing inputs equal to the number of partial syndromes.

As will be discussed below, the other operand of the GF multiplier 816 comes from the connection polynomial circuitry 604. This operand is a coefficient, lmd_add, computed in the connection polynomial circuitry 604 is used in the discrepancy circuitry 602 on the next cycle. Hence, the coefficient, lmd_add, is saved in the dcp_lambda register 810 for the duration.

After the first cycle, the accumulation process continues until the value of dcp_cnt equals dcp_length (i.e., L). When this occurs, the accumulated result, dcp_add, is saved to the lmd_delta register 820 so that the discrepancy circuitry can proceed to the next pipeline cycle to compute the next discrepancy $\Delta^{(k)}$ while the other circuitry 804 and 806 process the current discrepancy $\Delta^{(k)}$ saved in the lmd_delta register 820.

Figure 9:
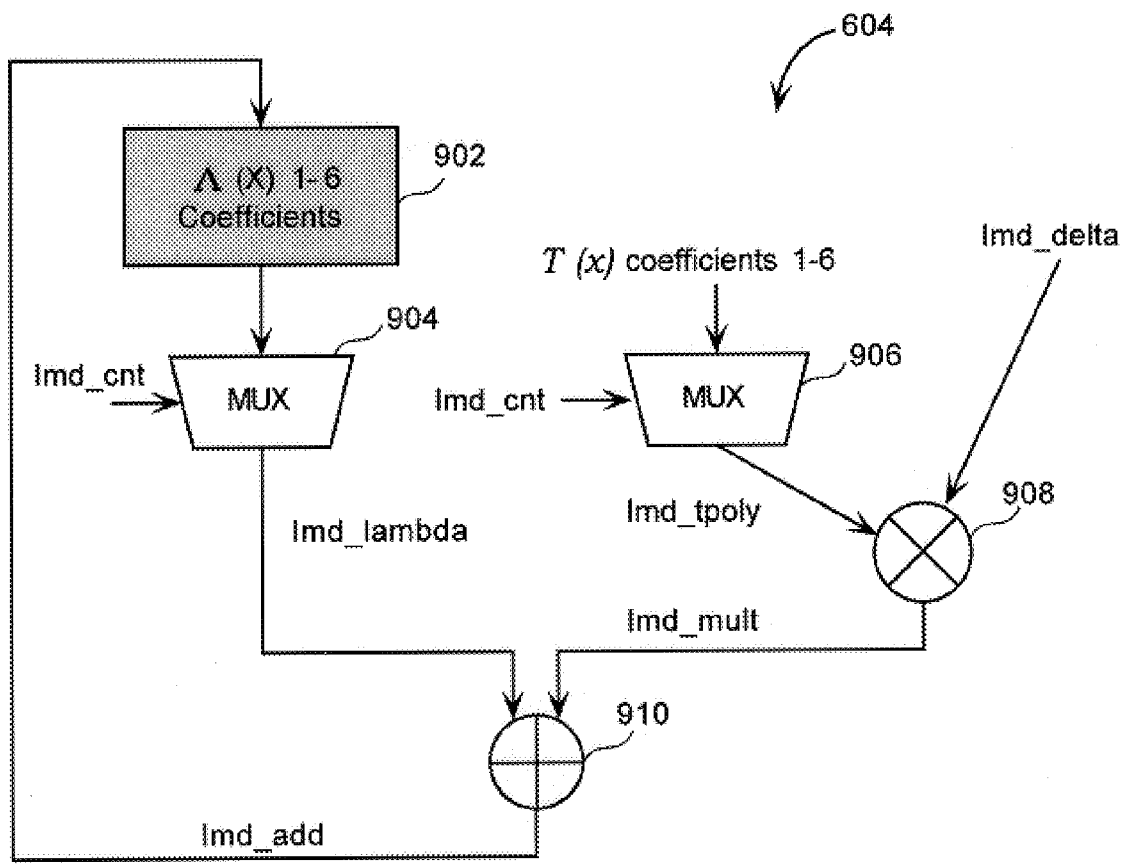
FIG. 9 illustrates a detailed diagram of the connection polynomial circuitry.

FIG. 9 illustrates a detailed diagram of the connection polynomial circuitry 604. The connection polynomial circuitry 604 determines the error locator polynomial $\Lambda^{(k)}(z)$ in accordance with the connection polynomial equation, $\Lambda^{(k)}(z)=\Lambda^{(k-1)}(z)-\Delta^{(k)}T(z)$. The connection polynomial circuitry 604 includes an error locator polynomial coefficient register 902, a pair of multiplexers 904 and 906, a GF multiplier 908, and an adder 910. The error locator polynomial coefficient register 902 stores the generated $\Lambda(z)$ coefficients and ultimately, its content is output as the error locator polynomial when the Berlekamp-Massey algorithm terminates.

With continuing reference to FIG. 9, the multiplexer 904 is coupled to the error locator polynomial coefficient register 902 to receive the stored coefficients. The control signal lmd_cnt received over line 722 from the control circuitry 608 enables the multiplexer 904 to select one of the $\Lambda(z)$ polynomial coefficients. The selected coefficient is output as lmd_lambda, which corresponds to the term $\Lambda^{(k-1)}(z)$ in the connection polynomial equation. The selected coefficient, lmd_lambda, is then fed into the adder 910 as an input. The selected coefficient, lmd_lambda, is also transmitted to a register tpl_lambda 1002 of the correction polynomial circuitry 606 to save storage space.

In order to determine the other term, $\Delta^{(k)}T(z)$, of the connection polynomial equation, the multiplexer 906 receives the coefficients of T(z) and in response to the control signal lmd_cnt, selects one of the T(z) coefficients as an output, lmd_tpoly. The GF multiplier 908 receives the output, lmd_tpoly, and the lmd_delta value from the register lmd_delta 820 in the discrepancy circuitry 602. The GF multiplier 908 multiplies the values of lmd_tpoly and lmd_delta to produce an output lmd_mult, which corresponds to the term $\Delta^{(k)}T(z)$ in the connection polynomial equation.

With continuing reference to FIG. 9, the adder receives and adds lmd_lambda and lmd_mult to generate an output sum, lmd_add, which updates one of the coefficients in the error locator polynomial coefficient register 902 corresponding to the connection polynomial, $\Lambda^{(k)}(z)$. The output sum lmd_add is then stored back into the error locator polynomial coefficient register 902. In the next cycle, the next coefficient stored in the error locator polynomial coefficient register 902 can be selected and used in a continuous manner. The generated coefficient, lmd_add, is also transmitted to register dcp_lambda 810 in the discrepancy circuitry 602.

Figure 10:
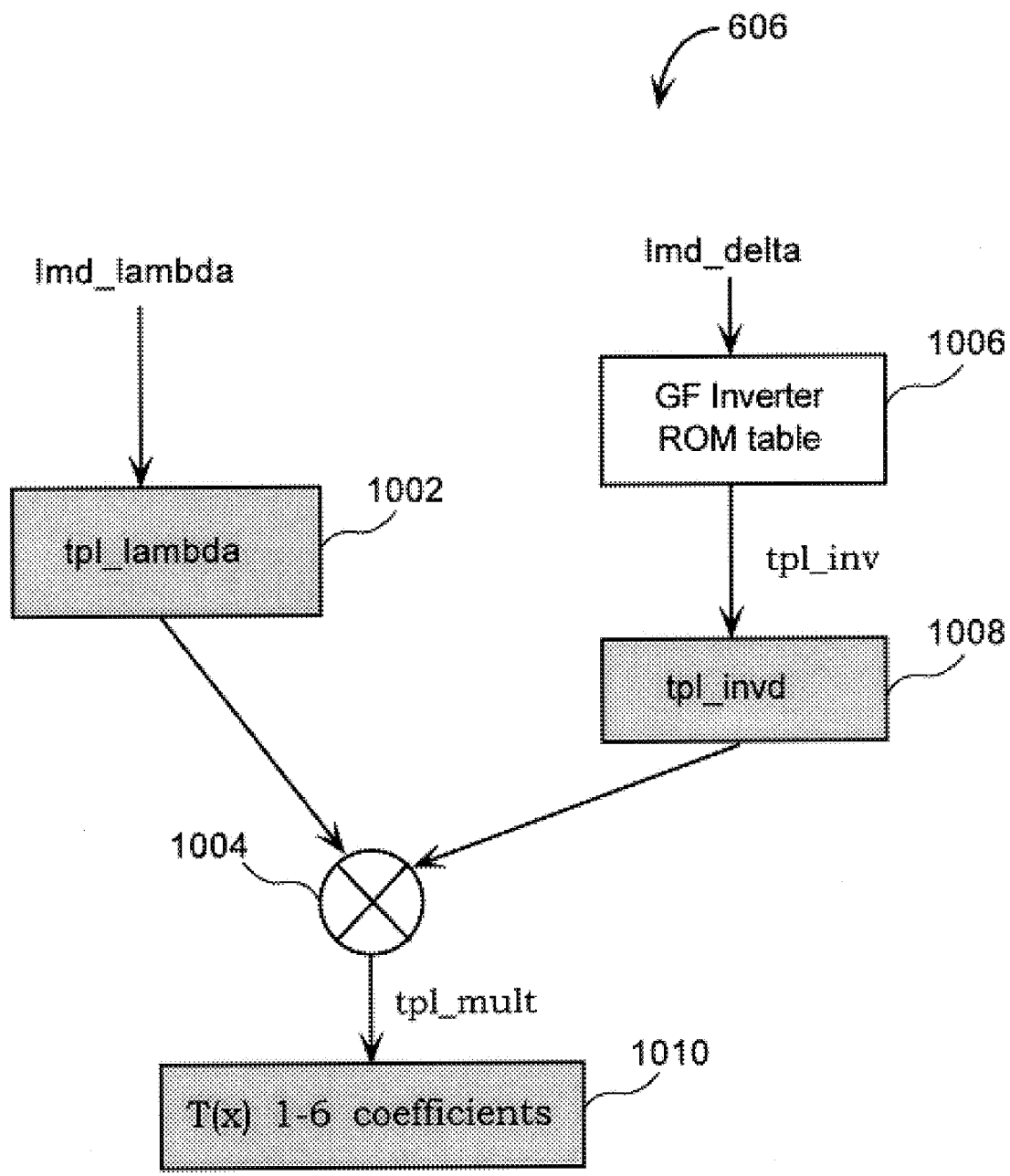
FIG. 10 shows a correction polynomial circuitry of the pipelined Berlekamp-Massey apparatus.

FIG. 10 shows a correction polynomial circuitry 606 of the Berlekamp-Massey apparatus 600. The correction polynomial circuitry 606 determines the correction polynomial, T(z), in accordance with equation $T(z)=\Lambda^{(k-1)}(z)/\Delta^{(k)}$. The correction polynomial circuitry 606 includes the register tpl_lambda 1002, a GF inverter 1006, a register tpl_invd 1008, a GF multiplier 1004, and a correction polynomial coefficient register 1010. The register tpl_lambda 1002 holds the lmd_lambda (i.e., $\Lambda^{(k-1)}(z)$) output from the multiplexer 904 in the connection polynomial circuitry 604 and feeds lmd_lambda into the GF multiplier 1004. On the other side, the content of lmd_delta register 820 (i.e., $\Delta^{(k)}$) in the discrepancy circuitry 602 is fed into the GF inverter 1006, which inverts the value of $\Delta^{(k)}$ into $1/\Delta^{(k)}$ so as to be able to perform straightforward multiplication instead of the division. Preferably, the GF inverter 1006 inverts $\Delta^{(k)}$ using a well known read-only-memory (ROM) table lookup technique.

With continuing reference to FIG. 10, the GF inverter 1006 outputs an inverted value as tpl_inv. The register tpl_invd 1008 receives tpl_inv and feeds it into the GF multiplier 1004. The GF multiplier 1004 performs GF multiplication and generates a product tpl_mult, which is stored into the correction polynomial coefficient register 1010.

In the Berlekamp-Massey apparatus 600, the discrepancy $\Delta^{(k)}$ and $\Lambda^{(z)}$ polynomial are computed in every loop of the pipeline Berlekamp-Massey algorithm 500. Although $\Lambda^{(z)}$ is not computed in the algorithm if descrepancy $\Delta^{(k)}$ is 0, it does not affect the ultimate result because $\Lambda^{(k)}(z)$ equals $\Lambda^{(k-1)}(z)$. Furthermore, the correction polynomial circuitry 606 bypasses the operation if $\Delta$ is 0 or if 2L is greater than or equal to k in the Berlekamp-Massey algorithm 500.

To compute new coefficients of $\Lambda(z)$ polynomial, the lmd_cnt signal from the lmd_cnt counter 710 signals the selection of the appropriate $\Lambda(z)$ and T(z) coefficients. Since the connection polynomial circuitry 604 is ahead of the discrepancy circuitry 602 by one clock cycle, the connection polynomial circuitry 604 is idle on the last clock cycle of every pipeline cycle. In addition, because of the data dependency between the connection and correction polynomial circuitry 604 and 606, the old coefficient of $\Lambda(z)$ polynomial is saved in register tpl_lambda 1002 while new coefficients of $\Lambda(z)$ polynomial are being computed. The register tpl_lambda 1002 functions as a temporary storage in the correction polynomial circuitry 606 because the result of table lookup is delayed by one clock cycle.

The product, tpl_mult, of the multiplication between the contents of tpl_lambda register 1002 and tpl_invd register 1008 updates one of the coefficients of T(z) polynomial in the correction polynomial coefficient register 1010, which is controlled by the same lmd_cnt 722. In operation, lmd_cnt is initially set to 1. When the GF multiplier 1004 generates the first tpl_mult, lmd_cnt becomes 2 due to the one clock cycle delay mentioned above. The lmd_cnt of 2 then enables selection of the second coefficient of T(z) polynomial in the correction polynomial coefficient register 1010 to be updated. This arrangement essentially accomplishes the shift operation 510 in the Berlekamp-Massey algorithm 500.

In accordance with another embodiment of the present invention, FIG. 11 illustrates an exemplary number of clock cycles needed to compute major variables sequentially when using a single GF multiplier in implementing the Berlekamp-Massey algorithm 300. It should be noted that this example assumes using twelve syndromes. The rows 1102 depict the major variables at different times or clock cycles, which are indicated by superscript numbers in the parenthesis. For example, $\Delta^{(1)}$ in block 1106 indicates the discrepancy value of $\Delta^{(k)}$ in the first pipeline cycle. On the other hand, the rows 1104 show the number of clock cycles needed to compute the value of the variable immediately above the number. For instance, the number "6" in block 1108 indicates that six clock cycles are needed to compute the value of $T^{(12)}$ in block 1110.

With reference to FIG. 11, the total number of clock cycles to compute the major variables are 121 cycles for 12 syndromes. In addition, the branch conditions in the Berlekamp-Massey algorithm also introduce clock cycle delays. Conservatively, one cycle is needed to run all branch conditions on one algorithm loop. Hence, in this embodiment, the implementation of the Berlekamp-Massey algorithm using one multiplier requires at least (121+12) or 133 cycles.

Figure 1:
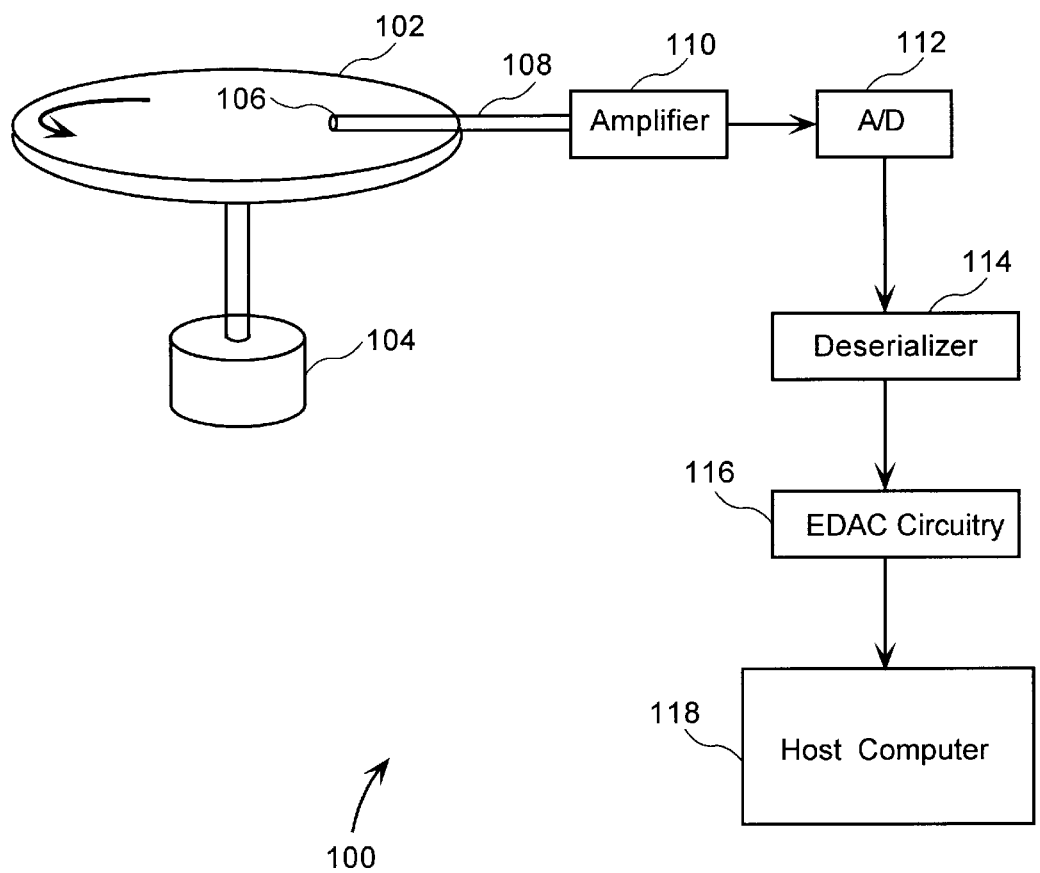
FIG. 1 illustrates a block diagram of a conventional computer system including a host computer that receives data from a hard disk.
Figure 2:
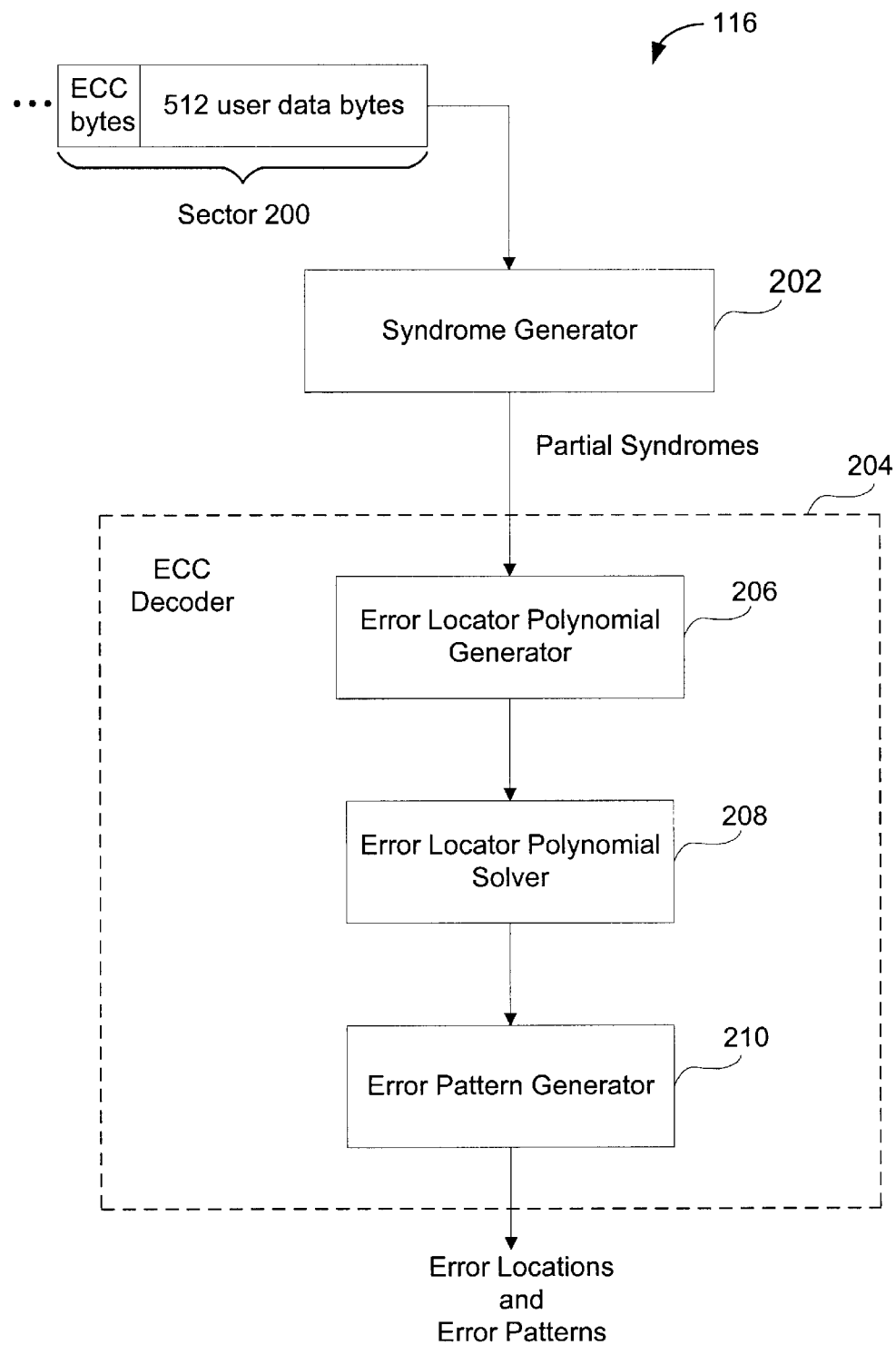
FIG. 2 shows a more detailed block diagram of an error detection and correction circuitry.
Figure 3:
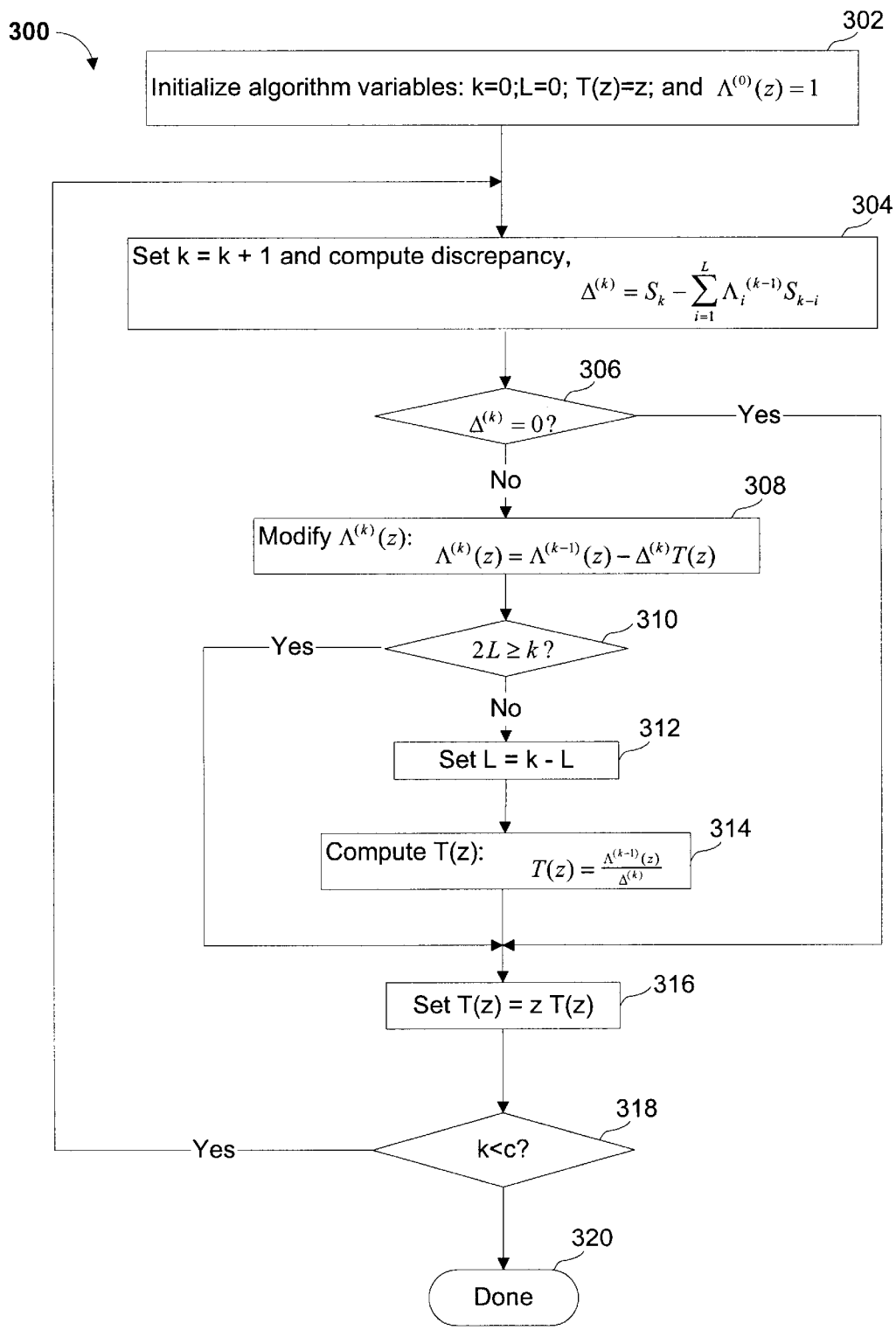
FIG. 3 illustrates a flow diagram of the operations involved in a conventional Berlekamp-Massey algorithm.

The single GF configuration of FIG. 11 also employs three storage arrays. The coefficients of $\Lambda(z)$ polynomial are saved in two storage arrays due to the data dependency between operations 308 and 314 of FIG. 3. Of the two storage arrays, one array stores the values of $\Lambda^{(k)}(z)$ and the other array stores the values of $\Lambda^{(k-1)}(z)$. Preferably, each storage array includes six 8-bit registers. Additionally, another storage array is provided to store T(z) polynomial.

In accordance with yet another aspect of the present invention, FIG. 12 shows an exemplary number of cycles needed to compute the major variables sequentially when using three GF multipliers to implement the Berlekamp-Massey algorithm 300. It should be noted that this example illustrates the cycles based on using twelve syndromes. The rows 1202 depict the major variables at different times or clock cycles, which are indicated by superscript numbers in the parenthesis. For example, $\Delta^{(1)}$ in block 1206 indicates the discrepancy value of $\Delta^{(k)}$ in the first pipeline cycle. On the other hand, the rows 1204 show the number of clock cycles needed to compute the value of the variable immediately above the number. For instance, the number "2" in block 1208 indicates that two clock cycles are needed to compute the value of $T^{(12)}$ in block 1210.

With continuing reference to FIG. 12, the total number of clock cycles to compute the major variables are 53 cycles for 12 syndromes. In addition, the branch conditions in the Berlekamp-Massey algorithm also introduce clock cycle delays. Conservatively, one cycle is needed to run all branch conditions on one algorithm loop. Hence, in this embodiment, the implementation of the Berlekamp-Massey algorithm using one multiplier requires at least (53+12) or 65 cycles.

The three GF configuration of FIG. 12 also employs three storage arrays. The coefficients of $\Lambda(z)$ polynomial are saved in two storage arrays due to the data dependency between operations 308 and 314 of FIG. 3. Of the two storage arrays, one array stores the values of $\Lambda^{(k)}(z)$ and the other array stores the values of $\Lambda^{(k-1)}(z)$. Preferably, each storage array includes six 8-bit registers. Additionally, another storage array is provided to store T(z) polynomial.

The present invention thus provides advantages of pipelined parallel processing. That is, the present invention allows pipelined parallel processing of the discrepancy $\Delta^{(k)}$ with the connection polynomial $\Lambda^{(k)}(z)$ and a correction polynomial T(z). Instead of computing these variables in sequence, one at a time, the pipelined parallel processing significantly improves processing cycles needed to compute these variables, which require resource intensive GF multipliers. The pipelined parallel processing is accomplished by resolving data dependency between two pipeline stages by delaying discrepancy processing by one cycle. In addition, the present invention computes the coefficients of $\Lambda^{(k)}(z)$ and T(z) polynomials at the same time. This parallel processing results in a saving of a storage array. Additionally, since the present invention utilizes pipelined storage elements (e.g., registers 810, 814, 1002, and 1008) before the GF multiplication to break up the critical paths, the present invention can operate at a high frequency clock speed.

The present invention may be implemented using any type of integrated circuit logic, state machines, or software driven computer-implemented operations. By way of example, a hardware description language (HDL) based design and synthesis program may be used to design the silicon-level circuitry necessary to appropriately perform the data and control operations in accordance with one embodiment of the present invention. By way of example, a VHDL® hardware description language available from IEEE of New York, N.Y. may be used to design an appropriate silicon-level layout. Although any suitable design tool may be used, another layout tool may include a hardware description language "Verilog®" tool available from Cadence Design Systems, Inc. of Santa Clara, Calif.

The invention may also employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations. An exemplary structure for the invention is described below.

Figure 13:
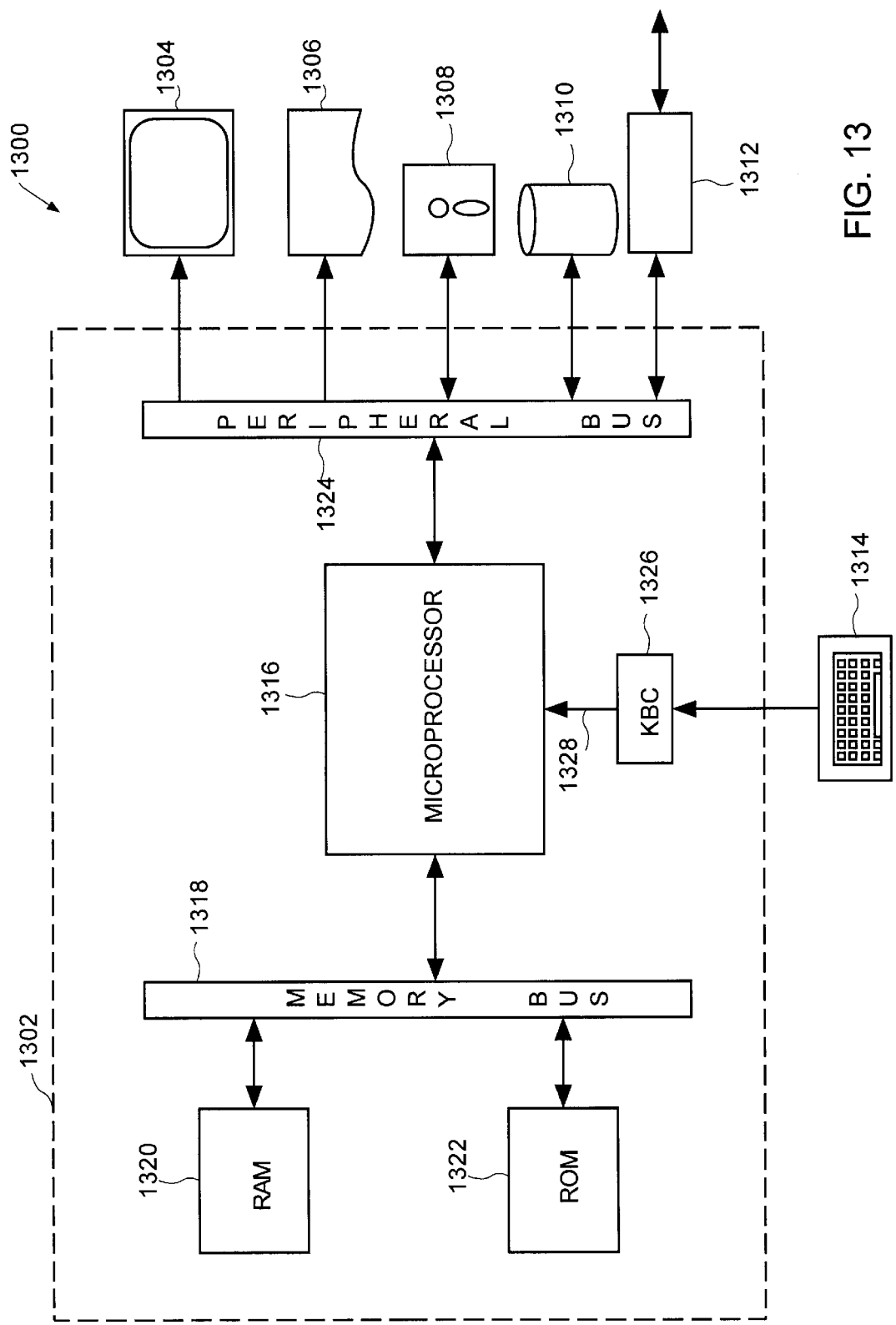
FIG. 13 illustrates a block diagram of an exemplary computer system for implementing Berlekamp-Massey algorithm in accordance with one aspect of the present invention.

FIG. 13 is a block diagram of an exemplary computer system 1300 for implementing processes of the present invention. The computer system 1300 includes a digital computer 1302, a display screen (or monitor) 1304, a printer 1306, a floppy disk drive 1308, a hard disk drive 1310, a network interface 1312, and a keyboard 1314. The digital computer 1302 includes a microprocessor 1316, a memory bus 1318, random access memory (RAM) 1320, read only memory (ROM) 1322, a peripheral bus 1324, and a keyboard control circuitry 1326. The digital computer 1300 can be a personal computer (such as an IBM compatible personal computer, a Macintosh computer or Macintosh compatible computer), a workstation computer (such as a Sun Microsystems or Hewlett-Packard workstation), or some other type of computer.

The microprocessor 1316 is a general purpose digital processor which controls the operation of the computer system 1300. The microprocessor 1316 can be a single-chip processor or can be implemented with multiple components. Using instructions retrieved from memory, the microprocessor 1316 controls the reception and manipulation of input data and the output and display of data on output devices. According to the invention, a particular function of microprocessor 1316 is to assist in the address location and positioning computations.

The memory bus 1318 is used by the microprocessor 1316 to access the RAM 1320 and the ROM 1322. The RAM 1320 is used by the microprocessor 1316 as a general storage area and as scratch-pad memory, and can also be used to store input data and processed data. The ROM 1322 can be used to store instructions or program code followed by the microprocessor 1316 as well as other data.

The peripheral bus 1324 is used to access the input, output, and storage devices used by the digital computer 1302. In the described embodiment, these devices include the display screen 1304, the printer device 1306, the floppy disk drive 1308, the hard disk drive 1310, and the network interface 1312. The keyboard control circuitry 1326 is used to receive input from keyboard 1314 and send decoded symbols for each pressed key to microprocessor 1316 over bus 1328.

The display screen 1304 is an output device that displays images of data provided by the microprocessor 1316 via the peripheral bus 1324 or provided by other components in the computer system 1300. The printer device 1306 when operating as a printer provides an image on a sheet of paper or a similar surface. Other output devices such as a plotter, typesetter, etc. can be used in place of, or in addition to, the printer device 1306.

The floppy disk drive 1308 and the hard disk drive 1310 can be used to store various types of data. The floppy disk drive 1308 facilitates transporting such data to other computer systems, and hard disk drive 1310 permits fast access to large amounts of stored data.

The microprocessor 1316 together with an operating system operate to execute computer code and produce and use data. The computer code and data may reside on the RAM 1320, the ROM 1322, or the hard disk drive 1310. The computer code and data could also reside on a removable program medium and loaded or installed onto the computer system 1300 when needed. Removable program mediums include, for example, CD-ROM, PC-CARD, floppy disk and magnetic tape.

The network interface 1312 is used to send and receive data over a network connected to other computer systems. An interface card or similar device and appropriate software implemented by the microprocessor 1316 can be used to connect the computer system 1300 to an existing network and transfer data according to standard protocols.

The keyboard 1314 is used by a user to input commands and other instructions to the computer system 1300. Other types of user input devices can also be used in conjunction with the present invention. For example, pointing devices such as a computer mouse, a track ball, a stylus, or a tablet can be used to manipulate a pointer on a screen of a general-purpose computer.

The invention can also be embodied as computer readable code on a computer readable medium. The computer readable medium is any data storage device that can store data which can be thereafter be read by a computer system. Examples of the computer readable medium include read-only memory, random-access memory, CD-ROMs, magnetic tape, optical data storage devices. The computer readable medium can also be distributed over a network coupled computer systems so that the computer readable cod e is stored and execute d in a distributed fashion.

Although the foregoing invention has bee n described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An apparatus for generating an error locator polynomial from a plurality of partial syndromes, which are generated from a data sector sequentially read from a storage medium, the apparatus comprising:

discrepancy circuitry configured to receive a selected partial syndrome for generating a discrepancy $\Delta^{(k)}$;

correction polynomial circuitry configured to receive the kth discrepancy $\Delta^{(k)}$ from the discrepancy circuitry for generating an associated correction polynomial T(z);

connection polynomial circuitry configured to receive the kth discrepancy $\Delta^{(k)}$ from the discrepancy circuitry for generating an associated connection polynomial $\Lambda^{(k)}$(z); and control circuitry for providing sequencing and control signals to the discrepancy circuitry, the correction polynomial circuitry, and the connection polynomial circuitry in accordance with Berlekamp-Massey algorithm, wherein the connection polynomial circuitry outputs the kth connection polynomial $\Lambda^{(k)}(z)$ as an error locator polynomial when k is equal to the total number of partial syndromes, wherein the connection polynomial circuitry, the correction polynomial circuitry, and the discrepancy circuitry determine the associated connection polynomial $\Lambda^{(k)}(z)$, the associated correction polynomial T(z), and the next discrepancy $\Delta^{(k+1)}$, respectively, in parallel and substantially at the same time.

2. The apparatus as recited in claim 1, wherein the connection polynomial circuitry provides the connection polynomial $\Lambda^{(k)}(z)$ to the discrepancy circuitry for determining the next discrepancy $\Delta^{(k+1)}$.

3. The apparatus as recited in claim 1, wherein the discrepancy circuitry receives the connection polynomial $\Lambda^{(k)}(z)$ one clock cycle after the connection polynomial circuitry determines the connection polynomial $\Lambda^{(k)}(z)$.

4. The apparatus as recited in claim 1, wherein the control circuitry provides k and L as sequencing and control signals in accordance with Berlekamp-Massey algorithm.

5. The apparatus as recited in claim 4, wherein the control circuitry initially sets k, L, $\Lambda^{(k)}(z)$, and T(z) to 0, 0, 1, and z, respectively.

6. The apparatus as recited in claim 5, wherein the control circuitry increments k from 0 to the number of partial syndromes.

7. The apparatus as recited in claim 5, wherein the error correction polynomial T(z) is incremented by multiplying z with T(z) whenever k is incremented.

8. The apparatus as recited in claim 7, wherein, if $\Delta^{(k)}$ is not equal to zero, the control circuitry determines whether 2L is greater than or equal to k.

9. The apparatus as recited in claim 8, wherein the control circuitry sets L equal to (k–L) if 2L is smaller than k.

10. The apparatus as recited in claim 5, wherein the control circuitry outputs L as the degree of the error locator polynomial.

11. The apparatus as recited in claim 1, wherein the storage medium is a magnetic medium.

12. The apparatus as recited in claim 1, wherein the storage medium is a hard disk.

13. The apparatus as recited in claim 1, wherein the discrepancy $\Delta^{(k)}$ is determined in accordance with discrepancy equation, $$\Delta^{(k)} = S_k - \sum_{i=1}^{L} \Lambda_i^{(k-1)} S_{k-i}.$$

14. The apparatus as recited in claim 1, wherein the connection polynomial $\Lambda^{(k)}(z)$ is determined in accordance with connection polynomial equation, $\Lambda^{(k)}(z)=\Lambda^{(k-1)}(z)-\Delta^{(k)}T(z)$.

15. The apparatus as recited in claim 1, wherein the error correction polynomial T(z) is determined in accordance with error correction polynomial equation, $T(z)=\Lambda^{(k-1)}(z)/\Delta^{(k)}$.

16. The apparatus as recited in claim 1, wherein the data sector is encoded in Reed-Solomon error correction code.

17. The apparatus as recited in claim 1, wherein the number of the partial syndromes is c and the selected partial syndrome is a kth partial syndrome.

18. The apparatus as recited in claim 1, wherein the discrepancy circuitry, the connection polynomial circuitry, and the correction polynomial circuitry each includes a GF multiplier.

19. The apparatus as recited in claim 1, wherein the discrepancy circuitry, the connection polynomial circuitry, and the correction polynomial circuitry share a GF multiplier.

20. In a computer system, a method for generating an error locator polynomial from a plurality of partial syndromes, which are generated from a data sector that is read sequentially from a storage medium, the method comprising the operations of:

a) receiving the plurality of partial syndromes;
b) initializing Berlekamp-Massey algorithm variables k, L, T(z), and $\Lambda^{(0)}(z)$ to 0, 0, z, and 1, respectively;
c) incrementing the index k by 1 and determining a discrepancy $\Delta^{(k)}$ of the Berlekamp-Massey algorithm;
d) determining a connection polynomial $\Lambda^{(k)}(z)$ and a correction polynomial T(z) of the Berlekamp-Massey algorithm based on the discrepancy $\Delta^{(k)}$ and the connection polynomial $\Lambda^{(k-1)}(z)$;
e) while the connection polynomial $\Lambda^{(k)}(z)$ and the correction polynomial T(z) are being determined, incrementing k by 1 and determining the discrepancy $\Delta^{(k)}$ by delaying the evaluation of discrepancy $\Delta^{(k)}$ until $\Lambda^{(k-1)}(z)$ becomes available from the operation d); and
f) incrementing the degree of the error correction polynomial T(z) and repeating the operations d) and e) in accordance with the Berlekamp-Massey algorithm to generate an error locator polynomial.

21. The method as recited in claim 20, wherein the connection polynomial $\Lambda^{(k)}(z)$ and the correction polynomial T(z) are determined if the discrepancy $\Delta^{(k)}$ is not equal to zero.

22. The method as recited in claim 21, wherein the correction polynomial T(z) is determined if 2L is less than k.

23. The method as recited in claim 22, wherein L is set equal to k–L whenever the correction polynomial T(z) is determined.

24. The method as recited in claim 23, further comprising the operation of:

g) generating L indicating the degree of the error locator polynomial.

25. The method as recited in claim 23, wherein the discrepancy $\Delta^{(k)}$ is determined one clock cycle after $\Lambda^{(k-1)}(z)$ becomes available.

26. The method as recited in claim 23, wherein operations d) and e) are repeated until k is equal to the number of the partial syndromes.

27. The method as recited in claim 23, wherein the storage medium is a magnetic medium.

28. The method as recited in claim 27 wherein the storage medium is a hard disk.

29. The method as recited in claim 23, wherein the degree of error correction polynomial T(z) is incremented by multiplying z and T(z).

30. The method as recited in claim 23 wherein the discrepancy $\Delta^{(k)}$ is determined in accordance with discrepancy equation, $$\Delta^{(k)} = S_k - \sum_{i=1}^{L} \Lambda_i^{(k-1)} S_{k-i}.$$

31. The method as recited in claim 23 wherein the connection polynomial $\Lambda^{(k)}(z)$ is determined in accordance with connection polynomial equation, $\Lambda^{(k)}(z)=\Lambda^{(k-1)}(z)-\Delta^{(k)}T(z)$.

32. The method as recited in claim 23 wherein the error correction polynomial T(z) is determined in accordance with error correction polynomial equation, $T(z)=\Lambda^{(k-1)}(z)/\Delta^{(k)}$.

33. The method as recited in claim 20 wherein the data sector is encoded in Reed-Solomon error correction code.

34. An apparatus for generating an error locator polynomial from a plurality of partial syndromes, which are generated from a data sector read sequentially from a storage medium, the apparatus comprising:

a discrepancy determining means configured to receive the plurality of partial syndromes for determining a discrepancy;

a connection and correction polynomial determining means configured to receive the discrepancy for determining a connection polynomial and a correction polynomial; and a control means for providing sequencing and control signals to the discrepancy determining means, the connection and correction polynomial determining means, wherein the connection and correction polynomial determining means outputs the connection polynomial as an error locator polynomial, wherein the connection polynomial determining means, the correction polynomial determining means, and the discrepancy determining means determine the connection polynomial $\Lambda^{(k)}(z)$, the correction polynomial $T(z)$, and a next discrepancy $\Delta^{(k+1)}$, respectively, in parallel and substantially at the same time.

35. The apparatus as recited in claim 34, wherein the discrepancy is $\Delta^{(k)}$, the connection polynomial is $\Lambda^{(k)}(z)$, and the correction polynomial is $T(z)$ in accordance with Berlekamp-Massey algorithm.

36. The apparatus as recited in claim 35, wherein the connection and correction polynomial determining means further comprises:

a connection polynomial determining means for determining the connection polynomial $\Lambda^{(k)}(z)$; and a correction polynomial determining means for determining the correction polynomial $T(z)$.

37. The apparatus as recited in claim 36, wherein the connection polynomial determining means provides the connection polynomial $\Lambda^{(k)}(z)$ to the discrepancy determining means for determining the next discrepancy $\Delta^{(k+1)}$.

38. The apparatus as recited in claim 37, wherein the discrepancy determining means receives the connection polynomial $\Lambda^{(k)}(z)$ one clock cycle after the connection polynomial determining means determines the connection polynomial $\Lambda^{(k)}(z)$.

39. The apparatus as recited in claim 38, wherein the control means provides k and L as sequencing and control signals in accordance with Berlekamp-Massey algorithm.

40. The apparatus as recited in claim 39, wherein the control means initially sets k, L, $\Lambda^{(k)}(z)$, and $T(z)$ to 0, 0, 1, and z, respectively.

41. The apparatus as recited in claim 40, wherein the control means increments k from 0 to the number of partial syndromes.

42. The apparatus as recited in claim 41, wherein the error correction polynomial $T(z)$ is incremented by multiplying z with $T(z)$ whenever k is incremented.

43. The apparatus as recited in claim 42, wherein the control determining means outputs L as the degree of the error locator polynomial.

44. The apparatus as recited in claim 35, wherein the discrepancy $\Delta^{(k)}$ is determined in accordance with discrepancy equation, $$\Delta^{(k)} = S_k - \sum_{i=1}^{L} \Lambda_i^{(k-1)} S_{k-i}.$$

45. The apparatus as recited in claim 35, wherein the connection polynomial $\Lambda^{(k)}(z)$ is determined in accordance with connection polynomial equation, $\Lambda^{(k)}(z) = \Lambda^{(k-1)}(z) - \Delta^{(k)} T(z)$.

46. The apparatus as recited in claim 35, wherein the error correction polynomial $T(z)$ is determined in accordance with error correction polynomial equation, $T(z) = \Lambda^{(k-1)}(z) / \Delta^{(k)}$.

47. The apparatus as recited in claim 34, wherein the storage medium is a magnetic medium.

48. The apparatus as recited in claim 47, wherein the storage medium is a hard disk.

49. The apparatus as recited in claim 34, wherein the data sector is encoded in Reed-Solomon error correction code.

50. The apparatus as recited in claim 34, wherein the number of the partial syndromes is c and the selected partial syndrome is a kth partial syndrome.

51. The apparatus as recited in claim 34, wherein the discrepancy determining means, the connection polynomial determining means, and the correction polynomial determining means each includes a GF multiplier.

52. The apparatus as recited in claim 34, wherein the discrepancy determining means, the connection polynomial determining means, and the correction polynomial determining means shares a GF multiplier.

* * * * *